United States Patent [19]
Bernard

[11] Patent Number: 4,812,817
[45] Date of Patent: Mar. 14, 1989

[54] DIFFERENTIAL ANALOG-DIGITAL CONVERTER WITH SWITCHED CAPACITORS

[75] Inventor: Patrick Bernard, Grenoble, France

[73] Assignee: Thomson Semiconducteurs, Paris, France

[21] Appl. No.: 105,280

[22] Filed: Oct. 7, 1987

[30] Foreign Application Priority Data

Oct. 7, 1986 [FR] France .................. 86 13935

[51] Int. Cl.$^4$ .......................................... H03K 13/02
[52] U.S. Cl. ................................................ 341/172
[58] Field of Search ............... 340/347 AD, 347 DA, 340/347 C, 347 M

[56] References Cited

U.S. PATENT DOCUMENTS 4,129,863 12/1978 Gray et al. .................. 340/347 AD

OTHER PUBLICATIONS

IEEE Journal of Solid-State Circuits, vol. SC-10, No. 6, Dec. 1975, pp. 497–499, New York, U.S.; P. R. Gray et al.: "Companded Pulse-Code Modulation Voice Codec Using Monolithic Weighted Capacitor Arrays".

Primary Examiner—Bernard Roskoski
Attorney, Agent, or Firm—Oblon, Fisher, Spivak, McClelland & Maier

[57] ABSTRACT

An analog digital converter is used to convert differential analog voltages, namely voltages with reference potentials that are not at ground. The arrangement described requires only one differential amplifier.

12 Claims, 3 Drawing Sheets

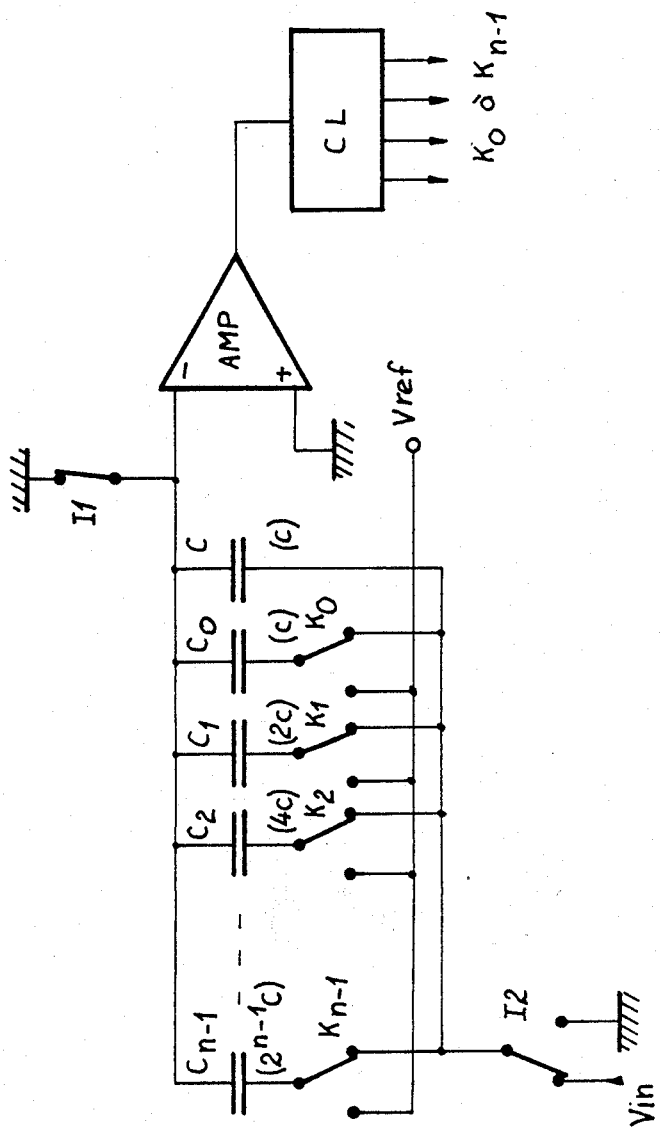
FIG_1 PRIOR ART

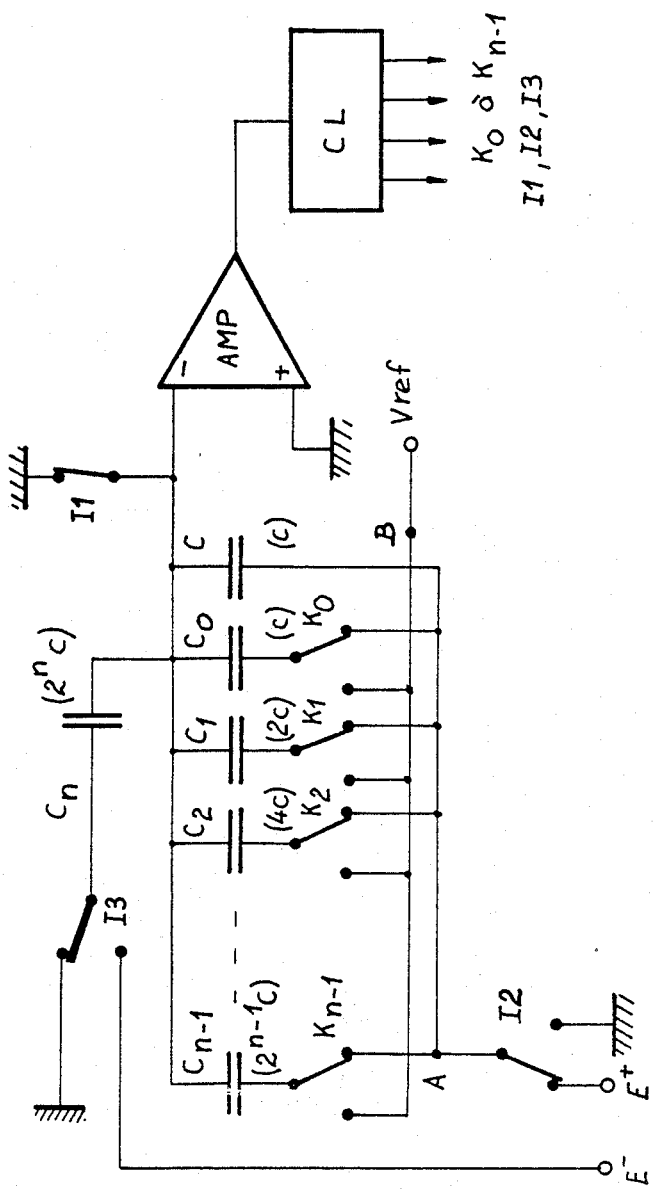
FIG_2

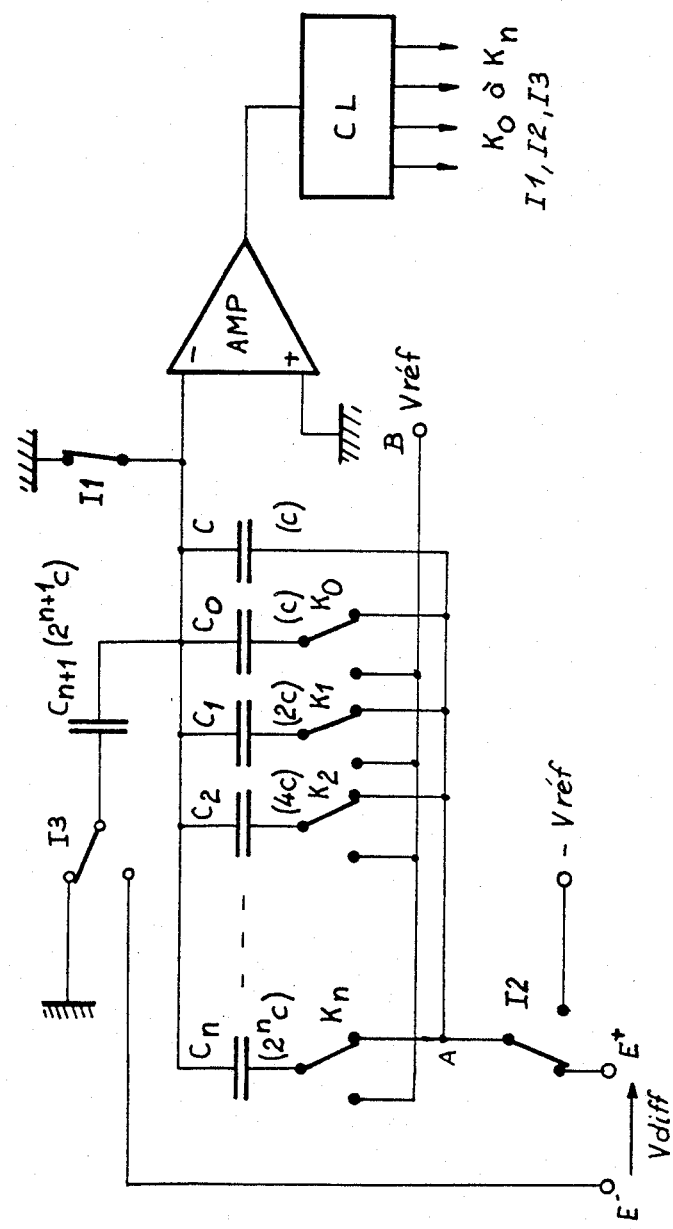
FIG_3

DIFFERENTIAL ANALOG-DIGITAL CONVERTER WITH SWITCHED CAPACITORS

BACKGROUND OF THE INVENTION

1. Field of the Invention

The invention pertains to an analog-digital converter that works on the principle of circuits with switched capacitors, i.e. using transfers of elementary electrical charges from input capacitors towards output capacitors.

2. Description of the Prior Art

A prior art diagram of a converter with switched capacitors is shown in FIG. 1.

This converter works under the control of a clock defining a sampling frequency F and the conversion is done in n+1 clock cycles where n is a whole number that defines the converting precision.

The circuit comprises n capacitances $C_o$ to $C_{n-1}$, weighted according to a pure binary code, the lowest-value capacitor having a value of c and the other capacitors having values of 2c, 4c, ... $2^{n-1}c$ respectively; furthermore, there is another capacitor provided, with a basic value of c.

The capacitors have a common armature terminal connected to the reversing input of a differential amplifier, the other (non-reversing) input of which is connected to the ground.

The other armature terminal of each capacitor may be connected either to the ground or to a reference potential Vref or, again, to an input analog voltage Vin which it is sought to convert. Finally, the reversing input of the amplifier may be connected to the ground by a switch.

The device works as follows:

In a first stage, with the reversing input of the amplifier grounded, the potential Vin to be converted is applied to all the capacitors. Then, the input of the amplifier is disconnected from the ground, so that a total charge remains stored at the armatures terminals of the capacitors which remain connected to the input of the amplifier.

In a second stage, the highest-value capacitor is connected to the reference potential Vref, while the others are all grounded. Depending on the value of the potential Vin (with respect to Vref), the output signal of the amplifier is flipped over to negative or positive, and this flip makes it possible to connect the highest-value capacitor (weight n−1) either to the ground or to Vref throughout the remaining part of the conversion.

In a third stage, it is the capacitor having the immediately smaller value (n−2) that is connected to Vref while the lower-value capacitors are grounded; here again, the direction in which the amplifier flips determines whether this capacitor with a value of n−2 is to be connected to the ground or to Vref throughout the rest of the conversion.

In the following stages, the capacitors with decreasing values are thus connected to Vref and then grounded or left at Vref, depending on the direction of the amplifier flips.

At the end of the conversion (stage n+1), the state of the switches connecting the various capacitors to the ground or to Vref defines a binary code representing a digital value of the analog voltage Vin to be converted.

This circuit arrangement is suited to the conversion of analog voltages provided that these voltages have reference potentials at ground potential (it being recalled that the amplifier has one non-reversing input permanently connected to the ground and one reversing input connected to the ground during the first stage).

If a differential voltage without a ground reference is to be convered into digital form, this voltage must first be transformed into a non-differential voltage with respect to a ground reference potential. This transformation requires an additional differential amplifier which it would be desirable to avoid.

The present invention proposes a conversion circuit with switched capacitors capable of converting differential voltages without requiring any additional differential amplifier.

The invention comprises essentially an additional capacitor with a value substantially equal to the sum of the other weighted capacitors of the system, and capacitor switching and connecting stages of capacitors which will be described below.

3. Summary of the Invention

A system according to the invention comprises, more precisely:

An input E+ and an input E−, as well as a ground point, with an analog voltage to be converted being applied between the input E+ and the input E−.

A high-gain differential amplifier with a non-reversing input connected to the ground and a reversing input;

A first change-over switch to connect the reversing input to the ground or to disconnect the reversing input from the ground;

A series of capacitors all having terminal connected, during the conversion, to the reversing input of the amplifier;

A series of change-over switches to connect the other terminal of each capacitor, except the one having the highest value, either to a first node of the circuit or to a second node, the second node being connected to a first reference potential;

A second change-over switch to connect the first node either to the input E+ or to a second reference potential;

A third change-over switch to connect the other terminal of the highest-value capacitor either to the input E− or to a third reference potential.

Preferably, the circuit further comprises an additional capacitor with a value equal to the lowest-value capacitor of the series, the said additional capacitor having one terminal connected to the reversing input of the differential amplifier and the other terminal connected to the first node of the circuit.

In a first embodiment of the invention, the second and third reference potentials are formed by the ground. In this case, however, it is necessary to begin every conversion stage by ascertaining that the analog voltage applied between the inputs E+ and E− actually has the same sign as the potential difference between the second reference potential and the ground. The amplifier may be used to make this preliminary comparison and, if necessary, to command a revresal of polarity of the analog voltage applied between the inputs E+ and E−.

It is preferable then to modify the circuit by providing an additional capacitor with a value which is half that of the lowest-value capacitor of the series. This additional capacitor is switched over between the first reference potential and the ground.

In another embodiment, the first reference potential is a positive potential +Vref, the second reference potential is a negative potential $-V_{ref}$ with the same value as the first potential, and the third potential is the ground.

BRIEF DESCRIPTION OF THE DRAWINGS

Other characteristics and advantages of the invention will appear from the following detailed description, made with reference to the appended drawings, of which:

FIG. 1, already described, shows a conversion circuit of the prior art;

FIG. 2 shows a first embodiment of the invention;

FIG. 3 shows a second embodiment.

The basic arrangement of the invention shown in FIG. 2 takes up the main elements of the diagram of FIG. 1. It comprises a high-gain differential amplifier AMP, with a reversing input designated by the − sign and a non-reversing input designated by the + sign, with a series of capacitors $C_o$, $C_1$, $C_2$...$C_{n-1}$, each having a terminal connected to the reversing input of the amplifier. The capacitors preferably have values weighted according to a binary code, in which case the lowest-value capacitor $C_o$ has a value c, the capacitor with the next higher value has a value of 2c, and the other capacitors successively have values of 4c, 8c, etc.

The series of capacitors is complemented by an additional capacitor $C_n$ (which did not exist in the diagram of FIG. 1), additional capacitor $C_n$ having a value which is substantially the sum of the other capacitors of the series and, in the more specific case of a binary weighting of the capacitors of the series, has a value of $2_nc$. Like the other capacitors, the capacitor $C_n$ has a terminal connected to the reversing input of the amplifier.

The other terminal of each capacitor $C_o$ to $C_{n-1}$ is connected to a change-over switch, $K_o$ to $K_{n-1}$ respectively, with can connect it either to a node A or to a node B.

The node A is connected to a change-over switch I2 which can be used to connect this node either to the first input E+ of the circuit or to a reference potential which, in this embodiment, is the ground.

The node B is connected to another reference potential designated by Vref.

The other terminal of the highest-value capacitor, namely the capacitor $C_n$, is connected to a change-over switch I3 which can connect it either to a second input E− of the circuit or to a third reference potential which, in this particular embodiment, is again the ground.

The circuit further comprises a switch I1 to connect the reversing input of the amplifier to the ground or to disconnect the said reversing input from the ground.

Finally, the circuit comprises two additional elements:

A capacitor C with a value equal to that of the lowest-value capacitor of the series, namely c, capacitor C being connected between the node A and the reversing input of the amplifier. The capacitor $C_n$ is in fact equal to the sum of this capacitor C and the series of weighted capacitors $C_o$ to $C_{n-1}$;

A logic circuit CL, the operation of which will be explained in detail and the main role of which is to control the different change-over switches to carry out a conversion sequence.

The circuit works as follows: an analog voltage to be converted is applied between the input E+ and the input E− of the circuit. It is the value of this voltage which will be converted, regardless of the reference of this voltage with respect to the ground.

During a first stage, all the change-over switches $K_o$ to $K_{n-1}$ connect the terminals of the capacitors $C_o$ to $C_{n-1}$ to the node A. Furthermore, the change-over switch I1 connects the reversing input of the amplifier to the ground. The change-over switch I2 connects the node A to the input E+. Finally, the change-over switch I3 connects the highest-value capacitor $C_n$ to the ground.

At the end of this first stage, an electrical charge is stored at the reversing input of the amplifier. This charge is trapped by opening the switch I1 before opening any other change-over switch.

In the second stage, after opening the switch I1, the node A is connected to the ground by the change-over switch I2, the highest-value capacitor $C_n$ is connected to the input E− by the change-over switch I3, and the capacitor $C_{n-1}$ is connected by the change-over switch $K_{n-1}$ to the node B, i.e. to the potential Vref. Calculations show that, depending on the charge stored during the first stage, a potential difference is set up at the input of the amplifier, and the sign of this potential difference is the sign of the difference between the voltage between the inputs E+ and E− and half of the reference voltage Vref.

The differential input voltage is therefore compared with Vref/2 and the high-gain amplifier flips in one direction or the other depending on the result of the comparison.

The following stages depend each time on the result of the preceding stage, and there are n+1 stages to make the conversion.

Thus, if, in the second stage, it is determined that the voltage applied is greater than Vref/2, then the switch $K_{n-1}$ remains connected for the following stages to the potential Vref, whereas if the voltage applied is smaller than Vref/2, then the switch $K_{n-1}$ will remain connected, during the following stages, to the node A, namely to the ground.

The i-1st stage consists in connecting the capacitor $C_{n-i+1}$, by means of the switch $K_{n-i+1}$, to Vref, the lower-rank capacitors being connected to the node A, hence to the ground, and the higher-rank capacitors being connected to Vref or to the node A depending on the result of the preceding stages.

It is the logic circuit CL that sequences the operations by making the switches flip over according to the signals produced at each stage by the amplifier AMP.

At the end of the stage n+1, the state of the change-over switches $K_o$ to $K_{n-1}$ represents a binary-coded digital value of the analog voltage applied between the inputs E+ and E−. The value assigned to each change-over switch is the value of the capacitor to which it is connected.

If the digital value defined by the state of the switches is k, then the analog input voltage has a value of $kV_{ref}/2^n$.

It must be noted that the direction of the differential voltage applied should be such that the input E+ is at a more positive voltage than the input E− if the potential Vref is positive with respect to the ground. If the voltage had a reverse direction, it would have been necessary to reverse it before applying it. If the direction is unknown a priori, the circuit may be arranged to function with a preliminary stage in which the voltage is applied to the input of the amplifier, and the direction in which the amplifier flips makes it possible to command (or not to command) the reversal of the direction of the differential voltage to be converted.

However, if this method is used, the digital analog conversion produces a zero code for an input voltage value range between $-\text{Vref}/2^n$ and $+\text{Vref}/2^n$, whereas it would be preferable for the zero code to correspond to an input voltage ranging between $-\text{Vref}/2^{n+1}$ and $+\text{Vref}/2^{n+1}$.

To obtain this latter result, it is proposed to have an additional capacitor, with a value of $c/2$, i.e. half that of the capacitor with the lowest value in the series, the additional capacitor being connected to the potential Vref during the first stage and to the ground during the following stages.

FIG. 3 shows an alternative embodiment which can be used, in a simple way, to take into account both positive and negative voltages between the inputs E+ and E− of the circuit.

This embodiment differs in two respects from that shown in FIG. 2:

Firstly, the reference potential to which the node A can be connected by the change-over switch 12 is no longer the ground but a potential −Vref which is equal to the potential Vref but has the opposite sign (the reference potential zero being the ground);

Secondly, but only if the same precision as in FIG. 2 is sought for both negative and positive voltages at the input of the circuit, there should be an additional capacitor in the series of weighted capacitors connected by a switch, either to the node A or to the potential Vref.

The diagram of FIG. 2 provides for $n+1$ weighted capacitors, $C_o$ to $C_n$ with values of c to $2^n c$, in this series, connected by switches $K_o$ to $K_n$ either to the node A or to the node B. An additional capacitor C, with a value c, directly connected to the node A, is again provided as in FIG. 2. Finally, the capacitor connected between the reversing input of the amplifier and the switch I3 is now a capacitor $C_{n+1}$, with a value $2^{n+1}c$ since it has to be equal, in principle, to the sum of the weighted capacitors and the additional capacitor C.

The arrangement shown in FIG. 3 works in the same way as that of FIG. 2, but there are $n+2$ stages instead of $n+1$, since the maximum dynamic range of conversion has been increased. The state of the change-over switches at the end of the stage $n+2$ defines the signed digital value of the analog voltage applied between the inputs E+ and E−. The sign bit is defined by the state of the change-over switch $K_n$.

What is claimed is:

1. An analog-digital converter comprising:
   an input E+ and an input E−, as well as a ground, with an analog voltage to be converted being applied between the input E+ and the input E−;
   a high-gain differential amplifier with a non-reversing input and a reversing input, said non-reversing input being connected to the ground;
   a first change-over switch to connect the reversing input to the ground or to disconnect the reversing input from the ground;
   a series of capacitors having values weighted according to a binaray sequence which ranges from a lowest-value capacitor to a highest-value capacitor all having a first terminal connected to the reversing input of the amplifier;
   a series of change-over switches to connect a second terminal of each capacitor, except the one having the highest value, either to a first node of the circuit or to a second node, the second node being connected to a first reference potential;
   a second change-over switch to connect the first node either to the input E+ or to a second reference potential; and
   a third change-over switch to connect a second terminal of the highest value capacitor either to the input E− or to a third reference potential.

2. An analog-digital converter according to claim 1, wherein:
   the second and third reference potentials are the ground.

3. An analog-digital converter according to claim 2, further comprising:
   an additional capacitor with a value equal to half that of the lowest-value capacitor of the series, said additional capacitor being switched-over between the first reference potential and the ground.

4. An analog-digital converter according to claim 1, wherein:
   the first reference potential is a positive potential +Vref, the second reference potential is a negative potential −Vref of the same magnitude as the first, and the third reference potential is the ground.

5. A converter according to claim 1, wherein:
   the lowest-value capacitor of said series of capacitors has a value c with the other capacitors of said series having a value equal to $2^n c$ where n is equal to one for a second lowest-value capacitor and increases by one for every additional capacitor of said series.

6. An analog-digital converter comprising:
   an input E+ and an input E−, as well as a ground, with an analog voltage to be converted being applied between the input E+ and the input E−;
   a high-gain differential amplifier with a non-reversing input and a reversing input, said non-reversing input being connected to the ground;
   a first change-over switch to connect the reversing input to the ground in a particular mode of its operation and to disconnect the reversing input from the ground in an alternative mode of its operation;
   a series of capacitors having values weighted according to a binary sequence which ranges from a lowest-value capacitor to a highest-value capacitor all of the capacitors having a first terminal connected to the reversing input of the differential amplifier;
   a series of change-over switches to connect a second terminal of each capacitor of said series of capacitors, except the highest-value capacitor, to a first node of the circuit in a particular mode of their operation and to a second node of the circuit in an alternative mode of their operation, the second node being connected to a first reference potential;
   a second change-over switch to connect the first node to the input E+ in a particular mode of its operation and to a second reference potential in an alternative mode of its operation;
   a third change-over switch to connect a second terminal of the highest-value capacitor to the input E− in particular mode of its operation and to a third reference potential in an alternative mode of its operation.

7. An analog-digital converter according to claim 6, further comprising:
   controlling means which individually controls the first change-over switch, the second change-over switch, the third change-over switch and each switch of the series of change-over switches.

8. An analog-digital converter according to claim 6, further comprising:

a single capacitor with a value equal to that of said lowest-value capacitor of said series of capacitors having a first terminal connected to said first node of the circuit and having a second terminal connected to the reversing input of the differential amplifier.

9. An analog-digital converter according to claim 1, wherein:

the second and third reference potentials are the ground.

10. An analog-digital converter according to claim 1, wherein:

the first reference potential is a positive potential +Vref, the second reference potential is a negative potential −Vref of the same magnitude as the first, and the third reference potential is the ground.

11. An analog-digital converter according to claim 1, wherein:

the lowest-value capacitor of said series of capacitors has a value c with the other capacitors of said series having a value equal to $2^n c$ where n is equal to one for a second lowest-value capacitor and increases by one for every additional capacitor of said series of capacitors.

12. An analog-digital converter comprising:

an input E+ and an input E−, as well as a ground, with an analog voltage to be converted being applied between the input E+ and the input E−;

a high-gain differential amplifier with a non-reversing input and a reversing input, said non-reversing input being connected to the ground;

a first change-over switch to connect the reversing input to the ground in a particular mode of its operation and to disconnect the reversing input from the ground in an alternative mode of its operation;

a series of capacitors having values weighted according to a binary sequence which ranges from a lowest-value capacitor to a highest-value capacitor all of the capacitors having a first terminal connected to the reversing input of the differential amplifier;

a series of change-over switches to connect a second terminal of each capacitor of said series of capacitors, except the highest-value capacitor, to a first node of the circuit in a particular mode of their operation and to a second node of the circuit in an alternative mode of their operation, the second node being connected to a first reference potential;

a second change-over switch to connect the first node to the input E+ in a particular mode if its operation and to a second reference potential in an alternative mode of its operation;

a third change-over switch to connect a second terminal of the highest-value capacitor to the input E− in a particular mode of its operation and to a third reference potential in an alternative mode of its operation;

a single capacitor with a value equal to that of said lowest-value capacitor of said series of capacitors having a first terminal connected to said first node of the circuit and having a second terminal connected to the reversing input of the differential amplifier; and controlling means which individually controls the first change-over switch, the second change-over switch, the third change-over switch and each switch of the series of change-over switches.

* * * * *